US005567332A

United States Patent [19]

Mehta

[11] Patent Number: 5,567,332
[45] Date of Patent: Oct. 22, 1996

[54] MICRO-MACHINE MANUFACTURING PROCESS

[75] Inventor: Jitesh Mehta, West Bloomington, Minn.

[73] Assignee: FSI International, Chaska, Minn.

[21] Appl. No.: 488,879

[22] Filed: Jun. 9, 1995

[51] Int. Cl.$^6$ ................................................ H01L 21/027
[52] U.S. Cl. ............................ 216/57; 216/76; 216/79; 216/101; 156/651.1
[58] Field of Search .................... 216/57, 76, 79, 216/99, 101; 156/647.1, 650.1, 651.1, 653.1, 646.1, 657.1

[56] References Cited

U.S. PATENT DOCUMENTS

| | | | |
|---|---|---|---|
| 4,372,803 | 2/1983 | Gigante | 156/657.1 |
| 4,749,440 | 6/1988 | Blackwood et al. | 156/646 |
| 5,043,043 | 8/1991 | Howe et al. | 156/645 |
| 5,089,084 | 2/1992 | Chhabra et al. | 156/646 |
| 5,093,594 | 3/1992 | Mehregany | 310/82 |
| 5,177,661 | 1/1993 | Zavracky et al. | 361/283 |
| 5,294,568 | 3/1994 | McNeilly et al. | 437/235 |

OTHER PUBLICATIONS

Wong et al, "Wafer Temperature Dependence of the Vapor–Phase HF Oxide Etch", J. Electrochem. Soc., 140, 205–208 (Jan. 1993).
Ruzyllo, et al, "Etching of Thermal Oxides in Low Pressure Anhydrous HF/CH$_2$OH Gas Mixture at Elevated Temperature", J. Electrochemical Soc. 140, L64–L66 (Apr. 1993).
Miki et al, "Vapor–Liquid Equilibrium of the Binary System HF–H$_2$O extending to Extremely Anhydrous Hydrogen Fluoride", J. Electrochem. Soc. 137, 787–790 9 (Mar. 1990).
Wong, et al, "Characterization of Wafer Cleaning and Oxide Etching Using Vapor–Phase Hydrogen Fluoride", J. Electrochem. Soc., 138, 1799–1802 (Jun. 1991).
Werkhoven, et al, "Contamination Control of Polysilicon Gates in a Vertical Reactor Cluster Tool," Journal of the IES, May/Jun. 1993, pp. 33–36.
Hendriks, et al, "Poly–gate Structures Manufactured in a Cluster Tool," Applied Surface Science, 70/71. (1993), 619–623.
Wantanabe, et al, "A New Cylindrical Capacitor Using Hemispherical Grained Si (HSG–Si) for 256Mb DRAMs", IEDM Technical Digest, 10.1.1–10.1.4 (Dec. 1992).
Helms, et al, "Mechanisms of the HF/H$_2$O Vapor Etching of SiO$_2$", J. Vac. Sci. Technol. A, 10, 806–811 (Jul./Aug. 1992).
Galewski, et al, "Silicon Wafer Preparation for Low–Temperature Selective Epitaxial Growth," IEEE Translations on Semiconductor Manufacturing, 93–98 (Aug. 1990).
Werknoven, et al, "Cluster–Tool Integrated HF Vapor Etching for Native Oxide Free Processing", Mat. Res. Soc. Proc., 315, pp. 211–217 (1993).
Martin, et al, "LPVCD Si$_3$N$_4$ growth retardation on silicon native oxide compared with in situ HF vapour–deglazed silicon substrates", Semicond. Sci. Technol. 6 (1991) 1100–1102.
N. Miki, et al, " Selective Etching of Native Oxide By Dry Processing Using Ultra Clean Anhydrous Hydrogen Fluoride", Hashimoto Chem. Ind. Co. Ltd, pp. 730–733 (1988).

(List continued on next page.)

Primary Examiner—R. Bruce Breneman
Assistant Examiner—George Goudreau
Attorney, Agent, or Firm—Vidas, Arrett & Steinkraus, P.A.

[57] ABSTRACT

A gaseous process for removing and vaporizing at least a portion of a silicon oxide film from between a substrate and a superstructure leaving a space between the substrate and the superstructure. The silicon oxide layer is removed in two steps. In the first step the bulk of the silicon oxide layer is removed by a rapid liquid or gaseous etching process, leaving at least a portion of the silicon oxide layer directly underlying the superstructure in place so as to support the superstructure during a wash cycle. In the second silicon oxide removal step the substrate is introduced to a high flow rate gaseous environment containing a relatively high concentration of anhydrous HF to which no, or only a relatively very low amount of, additional water vapor is provided until the silicon oxide directly underlying the superstructure has been removed.

9 Claims, 1 Drawing Sheet

OTHER PUBLICATIONS

A. Philipossian, "The Activity of HF/H₂O Treated Silicon Surfaces in Ambient Air Before and After Gate Oxidation", J. Electrochem. Soc. vol 139, No. 10, pp. 2956–2961, (Oct. 1992).

N. Miki, et al, "Gas–Phase Selective Etching of Native Oxide", Transactions on Electron Devices, vol. 37, No. 1, pp. 107–115, (Jan. 1990).

MICRO-MACHINE MANUFACTURING PROCESS

BACKGROUND OF THE INVENTION

In the field of miniaturization there is a growing interest in manufacturing operating machines on the scale of micrometers. Many of these miniature machines are polysilicon or other material superstructures on silicon substrates. Silicon oxide films of various stoichiometries are used as supports while building up the superstructures of such miniature machines. One of the critical steps in the manufacturing of these miniature machines involves the removal of the silicon oxide similar to the mechanical machining of excess material in making "big machine" components.

Many semiconductor device manufacturing processes require etching processes to allow for removal of one or more forms of silicon oxide in the production of the semiconductor device. One type of etching process used in the manufacture of semiconductor devices that has been conducted in the past is a wet acid etching procedure, typically involving liquid aqueous HF. The etch process involves exposure of the substrate to an aqueous HF solution followed by a wash and dry cycle to remove reactant and reaction product chemicals. However, this process is not easily adaptable to the manufacture of micro-machines. It has been difficult with the chemical etching processes previously known to achieve well defined edges on the etched surfaces. This is due to the chemical action of the wet etching which tends to etch isotopically, reducing the final feature dimensions. Wet etching is also problematic because at the completion of the etching process, thorough washing of the wafers is required to remove residual etching, cleaning agents and other contaminants. In the course of wet etching and the subsequent wash cycles, the surface tension and/or the turbulence, of the liquid HF and the wash solutions can easily destroy the superstructure by causing the superstructure to collapse on the silicon substrate as the silicon oxide support structure is removed.

Gas phase process procedures have been developed for silicon oxide etching utilizing a gaseous etchant medium. U.S. Pat. No. 4,749,440 to Blackwood et al. discloses a gas phase etching process for semiconductor substrates which has been implemented commercially. This process comprises exposing the substrate at near normal atmospheric pressure and room temperature to a continuously flowing atmosphere of reactive gas, preferably a mixture of anhydrous hydrogen fluoride gas mixed in a dry inert gas carrier together with a water vapor laden inert gas. The water vapor laden inert gas, preferably nitrogen, flows from a water vapor chamber, for mixing with the dry inert gas, preferably nitrogen, at a time prior to commencing flow of the anhydrous hydrogen fluoride gas and until the flow of hydrogen fluoride gas is terminated. In this process, it was discovered that mixing an anhydrous reactive gas with the inert gas and water vapor laden inert gas allows for repeatable, uniform and controllable etching at near ambient conditions. The procedure can be used in etching various types of silicon oxide films in the manufacture of integrated circuit chips, giving smooth reproducible surfaces on the substrate. However, a subsequent wash cycle is still required with this process to remove solid by-product contaminants such as $H_2SiF_6$ precipitates, which are occasionally deposited on the substrate surface as a result of side reactions of this process. Thus a process, such as disclosed in U.S. Pat. No. 4,749,440, cannot by itself only be satisfactorily implemented for manufacturing micro-machine structures.

Deposition of solid by-products of the $HF/SiO_2$ etching reaction can be reduced by substantially eliminating water vapor, but this reduces the rate of the etch reaction, making the reaction impractical for bulk removal of silicon oxide films on which a micro-machine superstructure has been built.

SUMMARY OF THE INVENTION

The invention is directed to a manufacturing process for producing three dimensional silicon or polysilicon structures on a substrate. The process operates on a construction comprising a superstructure of silicon or polysilicon which has been built up over a layer of silicon oxide on the substrate. The process is specifically directed to a method of removing the silicon oxide layer without destroying the overlying superstructure. The process of the invention breaks the silicon oxide removal into two distinct steps. In the first removal step, the bulk of the silicon oxide layer is removed by a rapid liquid or gaseous etching process, leaving at least a portion of the silicon oxide layer underlying the superstructure in place so as to support the superstructure during a wash cycle. A particularly suitable such process is the gaseous HF/water vapor etch process disclosed in U.S. Pat. No. 4,749,440. This first removal step is suitably followed by an appropriate wash and dry cycle to remove any residual etch chemicals and/or any byproduct contaminants on the substrate surface. In the second silicon oxide removal step the substrate is introduced into a high flow rate gaseous environment containing anhydrous HF to which no additional water vapor is provided. This gives a relatively slower etch of the remainder of the silicon oxide layer, but does so without significant contamination from reactant chemicals or reaction by-products. In combination, as described, the two step etch process of the invention overcomes the practical difficulties encountered in attempting to utilize either step individually as the sole silicon oxide etching method to produce micro-machine structures.

DETAILED DESCRIPTION OF THE INVENTION

Figure 1:
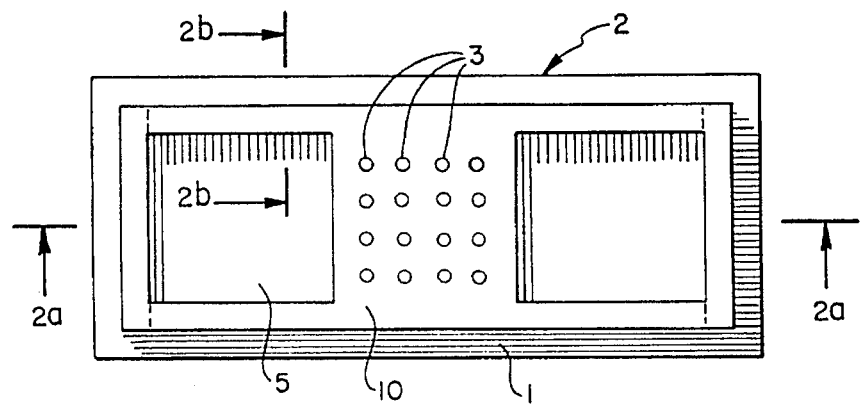
FIG. 1 is a top view of a structure on which the process is applied.

The substrate materials which can be employed in preparing the structures of the present process can generally be any type of substrate material, but commonly will constitute silicon or gallium arsenide wafer substrates. The superstructure is built up of silicon, such as polysilicon or amorphous silicon, by known methods for semiconductor manufacturing, using silicon oxide layers as support during the build-up of the superstructure.

In semiconductor device processing, oxides of silicon are used in many different forms. The stoichiometries and densities may vary somewhat from pure crystalline silicon dioxide. Dense, thermally grown oxides of silicon are typically used as the primary gate dielectric film in MOS (metal oxide-silicon) transistors. Steam grown thermal oxides are commonly used as a field oxidation dielectric layer. Undoped chemically deposited oxides, such as tetraethylorthosilicate derived oxide (TEOS), produced by wet or vapor (CVD) processes are other types of dense oxides commonly encountered. Other forms of silicon oxide commonly encountered are porous. Examples include doped oxides such as phosphosilicate glass (PSG) and borophosphosilicate glass (BPSG), which are commonly used as inter-metal layer dielectrics because they can be easily planarized with an elevated temperature reflow process. Spin-on-glass (SOG) is another porous oxide used in dielectric applications where planarization is critical. An SOG is a siloxane-type polymer in an organic solvent which is deposited in liquid form and then cured at elevated temperature to form a solid silicon oxide film. Other porous silicon oxides commonly encountered include borosilicate glass (BSG), boron doped TEOS, phosphorous doped TEOS and boron/phosphorous doped TEOS (BP TEOS). The silicon oxide layers utilized in the process of the invention may take any of these known forms.

After the superstructure has been constructed the silicon oxide support layer must be removed. In the inventive process the bulk of the silicon oxide layer is first removed by a conventional, etching process such as that disclosed in U.S. Pat. No. 4,749,440. In accordance therewith, anhydrous hydrogen fluoride gas and water vapor are utilized in a reaction chamber for etching silicon dioxide films. The anhydrous hydrogen fluoride gas is flowed with an inert carrier gas such as nitrogen. The water vapor is separately added to the gas mixture in a controlled amount to maintain a desired moisture level at the substrate surface in so as to rapidly initiate and maintain the reaction between the hydrogen fluoride and the silicon oxide film on the substrate to be etched. Suitable reaction condition ranges may be 22° to 25° C. temperature, 500 to 2000 cc/min flow rate of anhydrous HF gas, 15 to 60 liters/min of nitrogen carrier gas and 2 to 10 liters/min of water vapor laden nitrogen carrier gas. However, conditions outside these ranges may be employed without departing from the invention hereof. Preferred reaction conditions are 24° C., 1000 cc/min of HF gas, 20 liters of nitrogen carrier gas and 2 liters/min of water vapor laden nitrogen gas. The gas mixture is continuously exhausted so that gases are continuously flowed out of the process chamber as well as into the chamber, thereby removing gaseous reaction products.

The etchant reaction in the first step is very fast with the total amount of the silicon oxide film removed depending upon the relative concentration of hydrogen fluoride in the etchant mixture and the time of exposure. In the course of etching the surface, hydrogen fluoride vapors remove silicon dioxide by a chemical reaction which converts the solid silicon dioxide to a gaseous form, primarily $SiF_4$ and $H_2O$. However, in the presence of relatively high levels of water vapor, a side reaction produces $H_2SiF_6$, which can form solid deposits on the substrate surface. This must be washed off in a conventional wash cycle. To avoid destroying the superstructure during the wash cycle, etching by this method is halted while there is still sufficient supporting silicon oxide under the superstructure, suitably in the range of about 10–50% of the original structure, and typically about 5μ or less, to maintain the integrity of the superstructure during the wash cycle.

The substrate is then exposed to a second silicon oxide etch step using anhydrous HF gas, with no, or relatively low moisture, and a high flow rate of nitrogen carrier gas, to remove the remaining silicon oxide underlying the superstructure. Low moisture is referenced against conventional moisture levels employed in processes such as disclosed in U.S. Pat. No. 4,749,440, and preferably if any moisture is employed at all it is less than 10% that employed in the first stage reaction.

U.S. Pat. No. 4,749,440 describes the vapor phase etching of silicon dioxide as follows:

$$4HF + SiO_2 \xrightarrow{\text{water vapor}} SiF_4(\text{vapor}) + 2H_2O(\text{vapor})$$

Because water vapor is a by-product of the reaction, as well as a catalyst, the reaction can proceed even in the absence of added water vapor and at high gas flow rates which rapidly remove water vapor product. Under such conditions the side reaction or reactions which produce solid by-products such as $H_2SiF_6$ are substantially or entirely eliminated. However, the silicon oxide rate is also substantially reduced. Thus, the necessity of limiting the second silicon oxide etch step to very thin silicon oxide layers.

In the second stage, temperatures of at least 18° C. are generally desirable. Temperatures in the range of ambient to 55° C., or even higher, are generally suitable. Temperatures in the range of 100°–200° C. may be suitable in some circumstances. Temperatures higher than ambient, preferably at least about 35° C. are recommended.

Flow rates on the order of 45–60 liters per minute, i.e., double to triple the flow rates employed in moist HF vapor etch processes have been found to be most desirable.

The hydrogen fluoride is desirably added to the flowing inert gas to produce a gas mixture during the second step. Hydrogen fluoride concentration may suitably be maintained at about 1–10%, more preferably 3–5%. Concentrations outside these ranges, however, may be suitable or even optimal in other applications or under other conditions of pressure, temperature and flow rate.

The inert gas used in the present process may be any gas which is inert to the materials to be treated and which will remain in a gaseous phase under the process conditions present. Suitable gases include nitrogen, argon, neon, helium, krypton, and xenon. A particularly preferred inert gas according to the present invention is nitrogen. It is preferred to use pure nitrogen in the present process, such as chromatographic nitrogen.

The gas mixtures may be introduced into the processing chamber in a manner which creates a uniform radial laminar flow pattern over the substrate, for instance through a gas distribution showerhead. In this manner, removal of etching products is facilitated through entrainment in the laminar flow stream. However, the present invention may be accomplished using other reactive gas flow patterns.

Figure 2B:
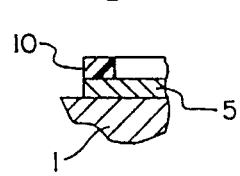
FIG. 2b is a fragmentary sectional view of the structure of FIG. 1 taken along line 2b—2b of FIG. 1.
Figure 2A:
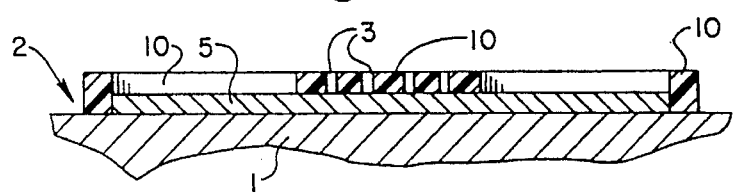
FIG. 2a is a sectional view of the structure of FIG. 1 taken along line 2a—2a of FIG. 1.

Referring now to the figures, there is shown therein 1–4 one specific example construction prepared to illustrate the invention. FIGS. 1 and 2a–2b show a layered preprocess structure, generally designated 2. A substrate 1, suitably a silicon wafer, has built upon it a superstructure 10 of polysilicon or the like. Interposed between a portion of the superstructure 10 and the substrate 1 is a layer or film 5 of silicon oxide of approximately 5000 Å thick. To assure effective gas penetration thereunder, holes 3 are provided through the broad central portion of superstructure 10.

Figure 3B:
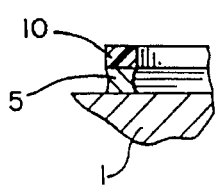
FIGS. 3a and 3b are views as in FIG. 2a and 2b, respectively, taken after the first silicon oxide removal step is complete.
Figure 3A:
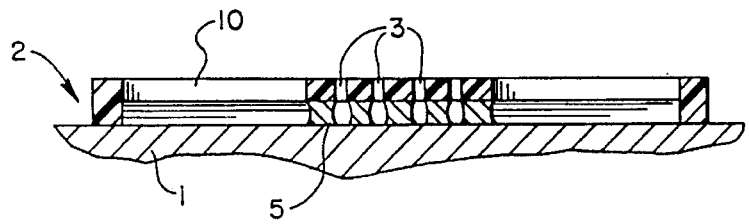

FIGS. 3a and 3b show the same structure after the first silicon oxide removal step and a standard wash and dry cycle. The first step is performed using a standard high moisture, or any other known high rate process, and results in removal of the portion of the oxide layer 5 in the open areas to the bare silicon substrate 1. This vertical etch down to the silicon substrate 1 is stopped in time so as to leave enough oxide, in this example less than 5μ, directly under the superstructure 10 to support the superstructure during the wash cycle.

Figure 4B:
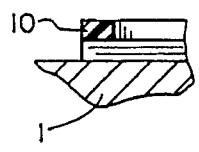
FIGS. 4a and 4b are views as in FIGS. 2a and 2b, respectively, taken after the completion of the second silicon oxide removal step.
Figure 4A:
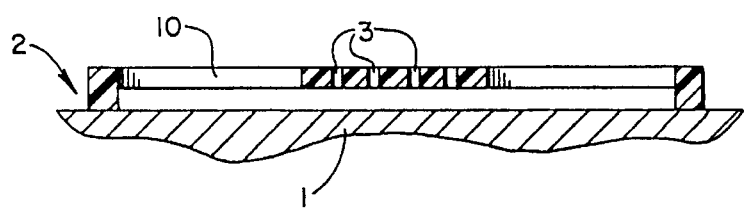

FIGS. 4a and 4b show the same structure after the second silicon oxide removal step. In the second step, a dry, high flow, high HF concentration gas mixture is spread evenly over the preprocess structure 2 and through perforations 3 in the superstructure, which are approximately 5μ apart in this particular embodiment. The rest of the $SiO_2$ is slowly etched away from under the poly-silicon superstructure until the final structure, as illustrated in FIGS. 4a and 4b, emerges. Since this is a high flow dry process, not enough moisture is generated as a by-product to create problems with precipitation of $H_2SiF_6$. This slow etch process allows the user to remove or etch away at the silicon oxide layer under the superstructure 10 with good control and uniformity. In the case of very critical superstructure designs using thermal oxides, it is preferred that no rinse/dry step may be used in the final dry, slow etch process. In the case of most other structures and especially those using doped oxides, a single water rinse/dry technique using process equiptment such as FSI International Excalibur® process equiptment may be used without damaging the superstructure.

It is found that thermally grown films are the most dense and have the slowest etch rate, requiring some adjustment in the concentration of the HF gas in the etching process. The vapor generated films grown in vapor and oxygen at elevated temperatures are common films countered in etching silicon wafers and are considered to be rather typical of the films etched. These vapor generated films are more readily etched at lower concentrations of the HF gas than are required for etching the thermally grown films. The films produced by chemical vapor deposition are less dense than the usual films encountered and are rapidly etched with lower concentrations of HF gas.

The above disclosure is intended to be illustrative and not exhaustive. It will suggest many variations and alternatives to one of ordinary skill in this art. In particular other well known rapid silicon oxide etching processes may be readily employed in step one of the invention in place of the specific HF/water vapor process discussed herein. Also, other structures, including cantilever, dual to multi-support bridge and other superstructures may be built by the inventive process. All these alternatives and variations are intended to be included within the scope of the attached claims. Those familiar with the art may recognize other equivalents to the specific embodiments described herein which equivalents are also intended to be encompassed by the claims attached hereto.

What is claimed is:

1. A manufacturing process for producing a three dimensional structure on a substrate, in which said structure has been built up of silicon on the substrate, with at least a portion of the structure overlying and supported by a layer of a silicon oxide on the substrate, the process comprising removing the silicon oxide layer in two steps, the first step comprising removing the bulk of the silicon oxide layer by a rapid liquid or gaseous etching process, leaving at least a portion of the silicon oxide layer directly underlying the structure in place so as to support the structure during a wash cycle, and the second silicon oxide removal step comprising introducing the substrate to a high flow rate gaseous environment containing anhydrous HF, said flow rate being at least about 20 liters/min, to which substantially no water is provided until the silicon oxide directly underlying the structure has been removed.

2. The process according to claim 1 further comprising, between said first and second steps, subjecting the substrate to a wash cycle to remove reactant chemicals and/or reaction by-products of the first step and drying the substrate.

3. The process according to claim 1 wherein the first step comprises introducing the substrate to hydrogen fluoride gas in the presence of water.

4. The process of claim 3 wherein in the first step, an anhydrous hydrogen fluoride gas and water are mixed just prior to introduction thereof to the substrate.

5. The process of claim 3 wherein in the first step, the anhydrous hydrogen fluoride gas is carried in a dry inert carrier gas.

6. The process of claim 1 wherein in the second step HF concentration is at least 1%.

7. The process according to claim 1 wherein the substrate is a silicon wafer.

8. The process of claim 7 wherein the reaction temperature in the second step is at least 18° C.

9. The process according to claim 7 wherein the structure comprises polysilicon or amorphous silicon.

* * * * *